United States Patent
Chung et al.

(10) Patent No.: US 6,590,434 B2
(45) Date of Patent: Jul. 8, 2003

(54) DELAY TIME CONTROLLING CIRCUIT AND METHOD FOR CONTROLLING DELAY TIME

(75) Inventors: Hoe-ju Chung, Suwon (KR);
Tae-seong Jang, Suwon (KR);
Kyu-hyoun Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/191,413

(22) Filed: Jul. 10, 2002

(65) Prior Publication Data

US 2003/0011417 A1 Jan. 16, 2003

(30) Foreign Application Priority Data

Jul. 14, 2001 (KR) .......................................... 2001/42602

(51) Int. Cl.[7] .............................................. H03H 11/26
(52) U.S. Cl. ........................ 327/277; 327/278; 327/284
(58) Field of Search ................................. 327/276, 277, 327/278, 282, 283, 284, 285; 361/91, 111; 365/225.7, 96

(56) References Cited

U.S. PATENT DOCUMENTS 5,428,311 A * 6/1995 McClure ..................... 327/276
6,232,813 B1 * 5/2001 Lee ............................ 327/278
6,310,506 B1 * 10/2001 Brown ....................... 327/284

* cited by examiner

Primary Examiner—Timothy P. Callahan
Assistant Examiner—An T. Luu
(74) Attorney, Agent, or Firm—Lee & Sterba, P.C.

(57) ABSTRACT

A delay time controlling circuit in a semiconductor memory device and method thereof for controlling a delay time preferably comprise a controller, a fuse unit having selectable fuse elements, a multiplexer, and a programmable variable delay circuit. With the multiplexer selecting the output of the controller, the controller generates a sequence of differing digital delay control signals to the programmable variable delay circuit in order to provide a plurality of unique delays in an output signal. When a desired time delay is monitored in the output signal, a programming signal is generated, which causes the specific digital control signal to be permanently programmed into the fuse unit via selective cutting of fuse elements. The multiplexer is then toggled via a selector fuse element to permanently select the output of the fuse unit as a control value source for the variable delay circuit.

31 Claims, 4 Drawing Sheets

DELAY TIME CONTROLLING CIRCUIT AND METHOD FOR CONTROLLING DELAY TIME

BACKGROUND OF THE INVENTION

1. Field of the Invention

The present invention relates to a semiconductor memory device, and more particularly, to a delay time controlling circuit of a semiconductor memory device, which is capable of controlling delay time and a method for controlling delay time.

2. Description of the Related Art

As integration density and operational speed of semiconductor memory devices increases, operational cycles inside a chip become faster, and accordingly, it becomes more difficult to control a skew of internal signals. Conventional semiconductor memory devices are typically tested before encapsulation in a carrier package (i.e., while in a wafer state) and produce test results that are equivalent to the results of testing a semiconductor memory device which is completely packaged.

However, in recently-developed semiconductor memory devices, new interface logic having higher operating speeds may include a delay locked loop (DLL) or a phase locked loop (PLL), circuit for compensating a clock skew. Since a test circuit for such memory devices may operate at a speed of about 100–250 MHz, it is typically manufactured to optimally test only the memory devices. Such optimization makes it is impossible to accurately test the operational characteristics of an interface logic circuit, a DLL circuit, or a PLL circuit with such a memory test circuit while a semiconductor memory device remains in a wafer state. Further, electrical signals in a semiconductor memory device operating at a speed of several hundred mega bytes per second may be significantly effected by parasitic impedances associated with a particular set of packaging properties, thus invalidating test measurements of the memory device wafer unless it is encapsulated in a finished product package. Since a sealed and packaged chip is very difficult to access, control of internal signals and test points makes accurate device testing possible only by using repeated trial and error methods, thereby increasing the manufacturing cost and lengthening processing time.

FIG. 1 illustrates a circuit diagram of a conventional delay-time controlling circuit 100 in a semiconductor memory device, which includes a variable delay line (VDL) 101, a fuse unit 103, and a pair of inverters 105 and 107.

Delay time controlling circuit 100 controls delay time in response to a digital input signal (m) derived from a selective cutting of particular fuses in fuse unit 103. In other words, in order to create a particular delay in a semiconductor memory device, the selected fuses in the fuse unit 103 are cut, thereby allowing the variable delay line (VDL) 101 and thence delay time controlling circuit 100 to delay signals in the semiconductor memory device. If no delay is needed in the semiconductor memory device, the fuses are not cut.

Disadvantageously, since the selected fuses are typically cut when the semiconductor memory device is still in a wafer state, associated wafer level testing cannot ensure accurate delay-time characteristics of the finished semiconductor memory device due to the electrical characteristics associated with the missing package.

As described above, the conventional delay time controlling circuit of a semiconductor memory device controls delay time under a condition wherein the semiconductor memory device is in a wafer state and not yet packaged. Accordingly, the characteristics of the semiconductor memory device may change after being packaged, in which case additional processes are required to accurately control any delay times, thereby increasing the manufacturing cost and processing time of semiconductor memory devices.

SUMMARY OF THE INVENTION

To solve the above-described problems, it is a first feature of an embodiment of the present invention to provide a delay time controlling circuit in a semiconductor memory device, which is capable of controlling a delay time of the semiconductor memory device after the semiconductor memory device has been completely encapsulated in a finished package. This setting of a delay time is preferably performed without the need of additional processes.

It is a second feature of the present invention to provide a method for controlling the delay time in a packaged semiconductor memory device.

A delay time controlling circuit according to a first embodiment of the present invention preferably includes: a programmable variable delay circuit, a controller, a fuse unit having electric fuses, a selection fuse, and a selector, which may be a multiplexer. The controller, which includes a register for storing data, generates a first code signal, which is an m-bit signal (where m is a natural number) in response to a first control signal, which is routed to the programmable variable delay circuit, thereby introducing a programmed time delay into an input signal. The fuse unit also receives the first code signal, cuts selected included fuses in response to a second control signal when a measured delay time reaches a target delay time, and generates a second code signal, which is an m-bit signal (where m is a natural number)that corresponds to the logic value of the fuses that are cut. The selection fuse is cut in response to a third control signal either simultaneously with or after the selected fuses in the fuse unit are cut. The selector selects one of the first and second code signals based on whether or not the selection fuse is cut and outputs the selected signal as a delay control signal for controlling the delay time of the programmable variable delay circuit. The first, second and third control signals may be generated externally to the time delaying circuit, and the second and third control signals may be the same signal.

A delay time controlling circuit according to a second embodiment of the present invention preferably includes a programmable variable delay circuit, a phase detector, a controller, a fuse unit having electric fuses, a selection fuse, and a selector, which may be a multiplexer. The phase detector compares the phase of a reference signal and the phase of an output signal of the programmable variable delay circuit in response to an enabling first control signal and generates a code control signal (based on the results of the comparison). The controller, which preferably has a register for storing and outputting a predetermined logic code, generates a first code signal, which is an m-bit signal (where m is a natural number) in response to the code control signal, which is routed to the programmable variable delay circuit, thereby introducing a programmed time delay into an input signal. The fuse unit also receives the first code signal, cuts fuses in itself in response to the second control signal if the measured delay time reaches a target delay time (i.e., the phase difference becomes zero,) and generates a second code signal, which is an m-bit signal (where m is a natural number) and corresponds to the logic value of the fuses that are cut. The selection fuse is cut in response to a third control signal. The selector selects one of the first and second code signals based on whether or not the selection fuse is cut and outputs the selected code signal as a delay control signal for controlling the delay time of the programmable variable delay circuit. Here, the code control signal controls the logic code of the controller based on the difference in phase between the reference signal and the output signal of the variable delay circuit. The second and third control signals may be generated internally or applied externally to the time delay controlling circuit and may be the same signal.

To achieve the second feature, there is provided a first method for controlling the delay time of a delay time controlling circuit according to the first embodiment of the present invention. The first method preferably includes (a) outputting a first code signal which is an m-bit signal (where m is a natural number) in response to a first control signal (which may also be an m-bit signal) (b) controlling and measuring the delay time of the programmable variable delay circuit in response to the first code signal, (c) cutting fuses in a fuse unit in response to a second control signal if the measured delay time reaches a target delay time and generating a second code signal which is an m-bit signal (where m is a natural number) and corresponds to the logic value of the fuses that are cut, and (d) outputting the second code signal as a delay control signal and thus fixing the delay time of the programmable variable delay circuit. The first and second control signals may be generated internally or applied externally to the time delay controlling circuit There is also provided a second method for controlling the delay time of a delay time controlling circuit according to the second embodiment of the present invention. The method preferably includes (a) comparing the phase of a reference signal which is an m-bit signal (where m is a natural number) and the phase of an output signal of the programmable variable delay circuit in response to a first control signal and generating a code control signal based on the results of the comparison, (b) generating a first code signal which is an m-bit signal (where m is a natural number) in response to the code control signal, (c) controlling and measuring delay time of the variable delay circuit in response to the first code signal, (d) cutting fuses in a fuse unit in response to a second control signal if the measured delay time reaches a target delay time and generating a second code signal which is an m-bit signal (where m is a natural number) and corresponds to the logic value of the fuses that are cut, and (e) outputting the second code signal as a delay control signal and thus fixing the delay time of the programmable variable delay circuit. Preferably, the code control signal controls the logic code of the first code signal based on the difference in phase between the reference signal and the output signal of the variable delay circuit Preferably, the delay time controlling circuit and the method for controlling delay time are capable of controlling the delay time of a semiconductor memory device after the semiconductor memory device has been completely packaged without the need of additional processes.

These and other features of the present invention will be readily apparent to those of ordinary skill in the art upon review of the detailed description that follows.

DETAILED DESCRIPTION OF THE INVENTION

Figure 1:
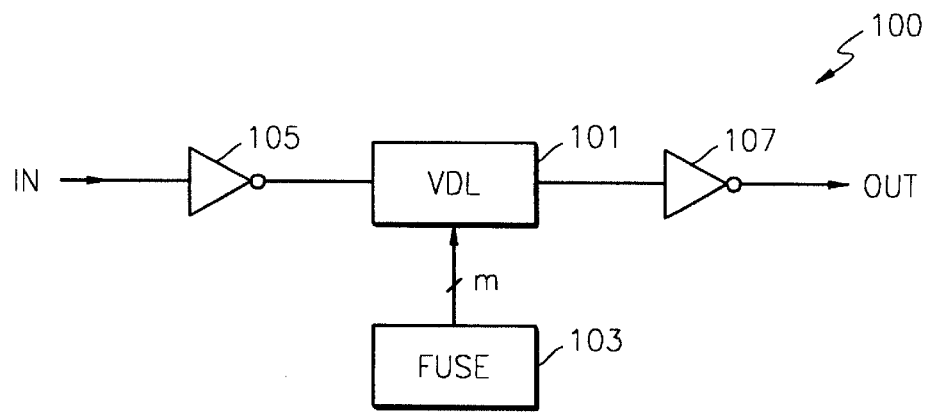
FIG. 1 illustrates a diagram of a conventional delay time controlling circuit.

Korean Patent Application No. 01-42602 filed on Jul. 14, 2001, and entitled "Delay Time Controlling Circuit and Method for Controlling Delay Time," is incorporated by reference herein in its entirety.

The present invention will now be described more fully with reference to the accompanying drawings, in which preferred embodiments of the invention are shown. The same reference numerals in different drawings represent the same elements.

Figure 2:
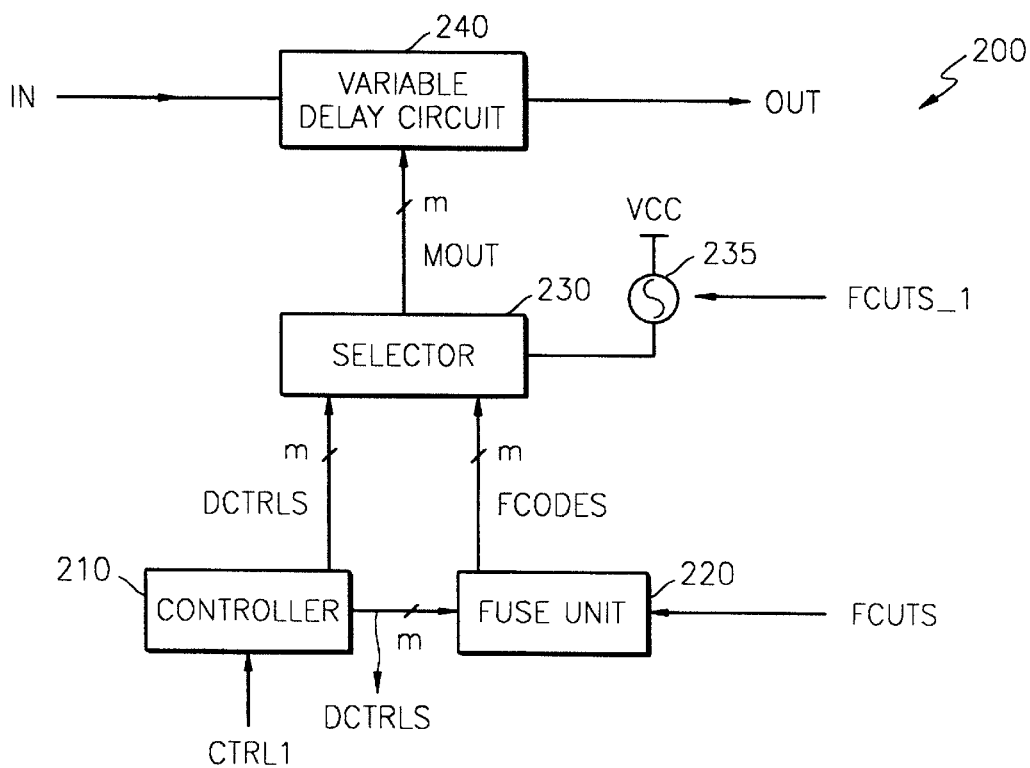
FIG. 2 illustrates a block diagram of a delay time controlling circuit according to a first embodiment of the present invention.

FIG. 2 illustrates a block diagram of a delay time controlling circuit according to a first embodiment of the present invention. Referring to FIG. 2, a delay time controlling circuit 200 preferably includes a controller 210, a fuse unit 220, a selection fuse 235, a selector 230, and a programmable variable delay circuit 240. Programmable variable delay circuit 240 generates a synchronized output signal (OUT) by adding a programmed time delay to an input signal (IN).

The programming of a particular time delay is preferably controlled by an m-bit delay control signal (MOUT), which may be generated by either a first m-bit code signal (DCTRLS) or a second m-bit code signal (FCODES), as selected by selector 230 based on the state of selection fuse 235. Initially, selection fuse 235 is conducting (i.e. a logical high in this example) and selector 230 is pointed to select and output first code signal (DCTRLS) which is generated in controller 210 in response to a first control signal CTRL1. By varying first control signal CTRL1, different time delays may be generated in programmable variable delay circuit 240 via corresponding signals DCTRLS and MOUT. Such variation may be caused by a monotonically increasing or decreasing signal or may be a special signal controlled using an algorithm. The variations are applied to determine a particular time delay for signal OUT for a given IC operating at a particular frequency.

Variations in output signal (OUT) are preferably monitored, and when a desired time delay has been attained, a second control signal (FCUTS) is externally generated and applied to fuse unit 220, wherein a plurality of fuses corresponding to the current value of inputted first m-bit code signal (DCTRLS) are cut. This fuse-cutting action causes second m-bit code signal (FCODES), which corresponds to the logical values of the fuses that are cut, to be output by fuse unit 220 as a value that is identical to the present value of first code signal (DCTRLS). Preferably, to insure static programming values during the fuse-cutting operation, further changes in control signal CTRL1 are halted until completion of the fuse-cutting operation. Upon the application of second m-bit code signal (FCODES), a third m-bit control signal (FCUTS_1) is generated and applied to selection fuse 235, causing it to be cut, thereby causing selector 230 to select the output of newly-programmed fuse unit 220. Thus, the programming value of signal MOUT is permanently set via the fused pattern value of signal FCODES and is retained even after removal of first control signal CTRL1.

Controller 210 preferably includes a register for storing a logic value of first control signal CTRL1. Here, the second control signal FCUTS and the third control signal FCUTS_1 are preferably applied from the outside of the delay time controlling circuit 200. In addition, the third control signal FCUTS_1 may be the same signal as the second control signal FCUTS. The fuses in the fuse unit 220 may be electric fuses, and selector 230 may be a multiplexer. In the foregoing, the delay time of the programmable variable delay circuit 240 is fixed at a predetermined value by the second code signal FCODES. Accordingly, it is possible to control the delay time through the use of the register of the controller 210 after packaging a semiconductor memory device. Further, it can be appreciated that although the foregoing discussion refers to fuses as being cut (i.e. creating an open circuit condition) as a programming mechanism, other devices, such as fusable links, may be used which are programmed in an opposite manner (i.e., creating a short circuit condition) and still be within the scope of the present invention.

Figure 3:
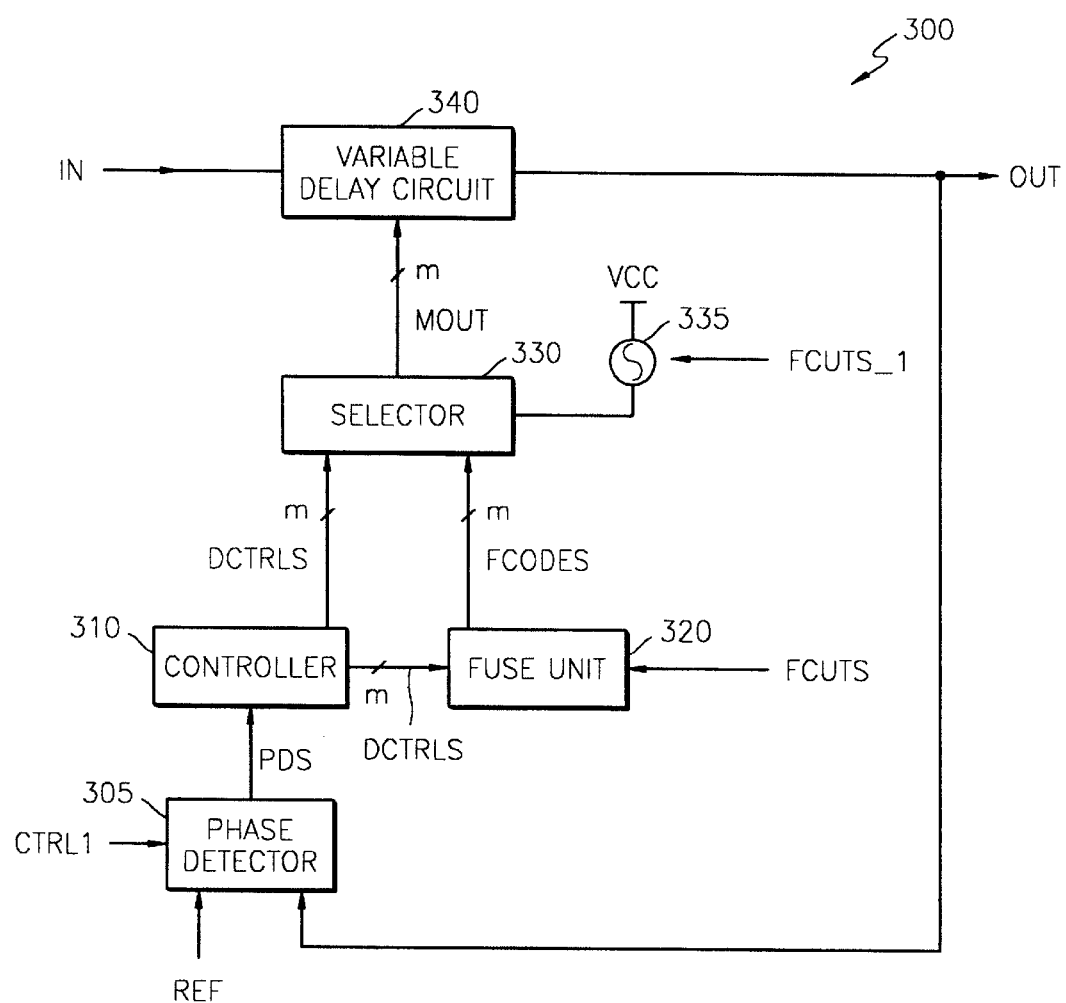
FIG. 3 illustrates a block diagram of a delay time controlling circuit according to a second embodiment of the present invention.

Referring to FIG. 3, a delay time controlling circuit 300 according to a second embodiment of the present invention preferably includes a phase detector 305, a controller 310, a fuse unit 320, a selection fuse 335, a selector 330, and a programmable variable delay circuit 340.

Phase detector 305 compares the phase of a reference signal REF and the phase of an output signal OUT of variable delay circuit 340 and generates a code control signal PDS corresponding to the result of the comparison upon activation of an enabling first control signal CTRL1. In response to the code control signal PDS, controller 310 generates an m-bit first code signal DCTRLS, which is communicated to selector 330, fuse unit 320, and programmable variable delay circuit 340. Similar to the first embodiment, programmable variable delay circuit 340 adds a programmed time delay to an input signal IN to create a delayed output signal OUT. If a desired time delay is generated (i.e. a specific time delay is measured or the logic code of the first code signal DCTRLS remains unchanged for a predetermined amount of time), a second control signal FCUTS is generated, and fuses in the fuse unit 320 are cut in response to FCUTS as in the first embodiment. Fuse unit 320 thus generates a second code signal FCODES which is an m-bit signal and corresponds to the logic value of the fuses that are cut. The selection fuse 335 is cut in response to a third control signal FCUTS_1 to cause selector 330 to permanently select the output of fuse unit 320 as the source for MOUT and thus the input for programmable variable delay circuit 340. In other words, selector 330 selects one of the first and second code signals, DCTRLS and FCODES, respectively, based on whether or not the selection fuse 335 is cut and outputs the selected signal to programmable variable delay circuit 340 as a delay control signal MOUT to control delay time of the programmable variable delay circuit 340 in a manner similar to that used in the first embodiment.

Hereinafter, the operation of the delay time controlling circuit 300 according to the second embodiment of the present invention will be described in greater detail with reference to FIG. 3.

The first control signal CTRL1, which is a command gating function, is preferably applied from the inside of the delay time controlling circuit 300, and enables phase detector 305 to begin performing an auto-trimming operation.

When enabled, phase detector 305 compares the phase of the reference signal REF and the phase of a sensed signal and generates the code control signal PDS based on the result of that comparison. The sensed signal may comprise the output signal OUT of the programmable variable delay circuit 340 or may comprise another signal of a node in the same semiconductor memory device. The code control signal PDS is for increases/decreases the logic code of the controller 310, which preferably is a counter and thus includes a register. As code control signal PDS is applied to controller 310, the logical output value of the counter of the controller 310 increases/decreases a corresponding amount and is stored in the register as the first code signal DCTRLS.

As in the first embodiment, the first code signal DCTRLS is simultaneously applied to both the fuse unit 320 and the selector 330. The selector 330 selects one of the first and second code signals DCTRLS and FCODES and applies the selected signal to variable delay circuit 340 as the delay control signal MOUT. Until the second code signal FCODES is selected by the cutting of selection fuse 335 after programming of the fuse unit 320, the first code signal DCTRLS is applied to the programmable variable delay circuit 340, thereby controlling the delay time of the programmable variable delay circuit 340.

When the phase of the reference signal REF equals the phase of the output signal OUT of the variable delay circuit 340, no further changes are created in the counter and thus the output of the controller 310. Preferably, after a predetermined time has passed while at that matched and unchanging condition, the auto-trimming operation stops, and second control signal FCUTS is generated, causing the fuses in the fuse unit 320 to be cut based on the last stored logic code of the first code signal DCTRLS. At the same time, the selection fuse 335 is cut in response to the third control signal FCUTS_1. Here, the second control signal FCUTS and the third control signal FCUTS_1 may be applied from the outside of the delay time controlling circuit 300 or may be commands generated inside the delay time controlling circuit 300. In addition, the third control signal FCUTS_1 may be the same as the second control signal FCUTS. Here, the fuses of the fuse unit 320 may be electric fuses. When the selection fuse 335 is cut, the selector 330, which may be a multiplexer, selects and outputs the second code signal FCODES to the variable delay circuit 340. Thus, the delay time of the programmable variable delay circuit 340 is permanently fixed at a predetermined time by the second code signal FCODES. Accordingly, it is possible to control delay time through the use of the register of controller 310 to fix the delay time, even after packaging a semiconductor memory device.

Figure 4:
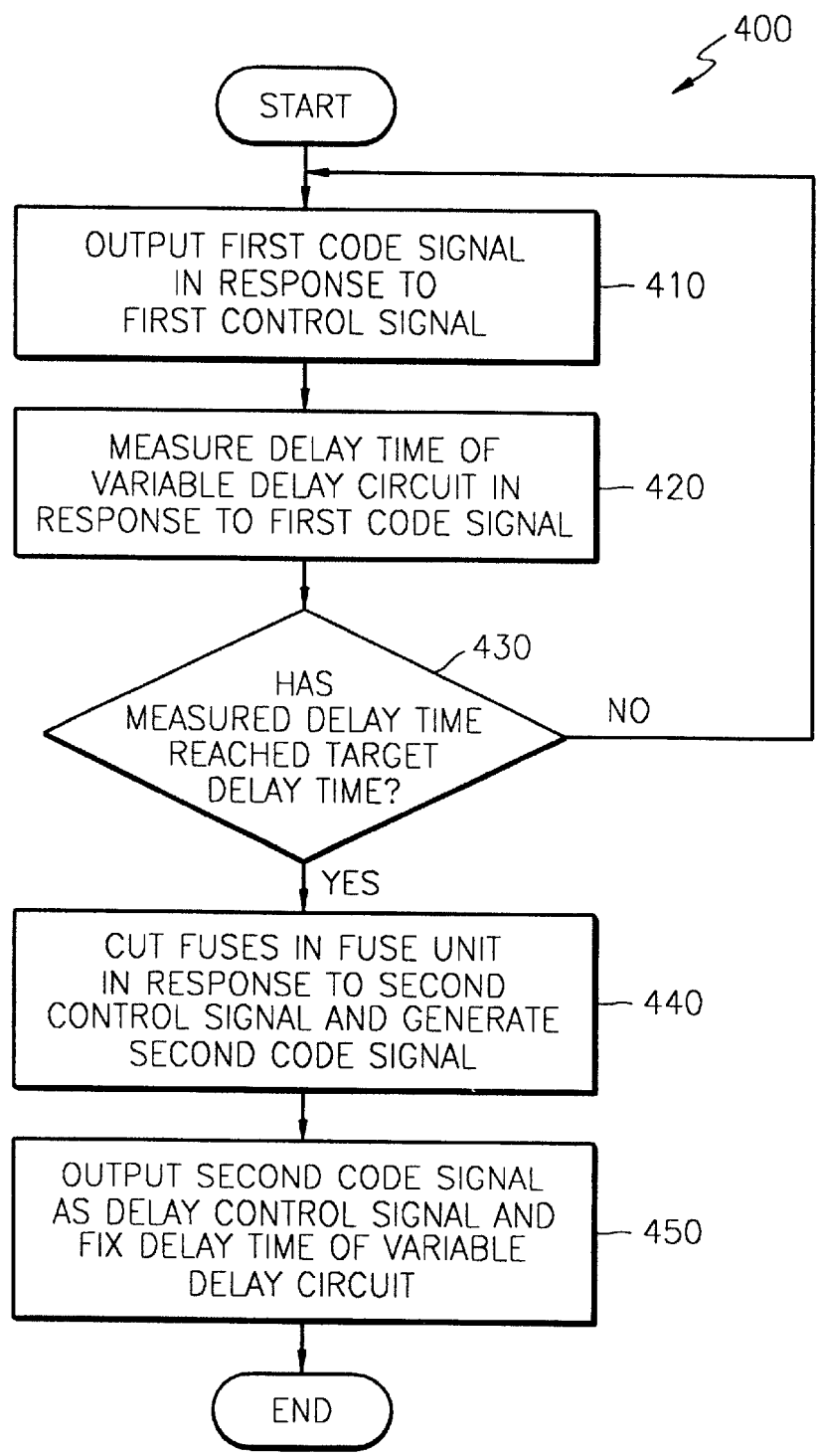
FIG. 4 illustrates a flow chart showing preferred steps of a method for generating a delay signal according to the first embodiment of the present invention.

Referring to FIG. 4, in a preferred method 400 for controlling the delay time of a delay time controlling circuit, which includes a programmable variable delay circuit, a first step 410 preferably comprises generating a first code signal that is a m-bit signal (m is a natural number) in response to a first control signal (i.e., the logic code of the first code signal varies as a function of variations in the first control signal). Here, the first control signal is an m-bit signal, the logic code of which is controlled external to the delay time controlling circuit. The delay time of the variable delay circuit is measured in step 420.

In step 430 the measured delay time is compared with a target delay time. The target delay time indicates a period of time for which the variable delay circuit is desired to be delayed. Until the measured delay time matches the target delay time, the logic code of the first code signal is continuously varied by the first control signal.

If the measured delay time does not match the target delay time, the first code signal is applied to the variable delay circuit via a selector included in the delay time controlling circuit such that the delay time of the variable delay circuit is controlled and the logic code of the first code signal is continuously varied by the first control signal. On the other hand, if the measured delay time does match the target delay time, the variation in the logic code of the first control signal is halted, and the logic code value at the moment that the logic code of the first control signal is halted is output as the first code signal. Fuses are cut based on the logic code of the first code signal upon application of a second control signal, thereby generating a second code signal, which is an m-bit signal and corresponds to the logic value of the fuses that are cut, in step 440. When the second code signal is generated, the selector 330 selects and outputs the second code signal as a delay control signal to the programmable variable delay circuit, thereby permanently setting the delay time of the variable delay circuit at a predetermined time in step 450.

Figure 5:
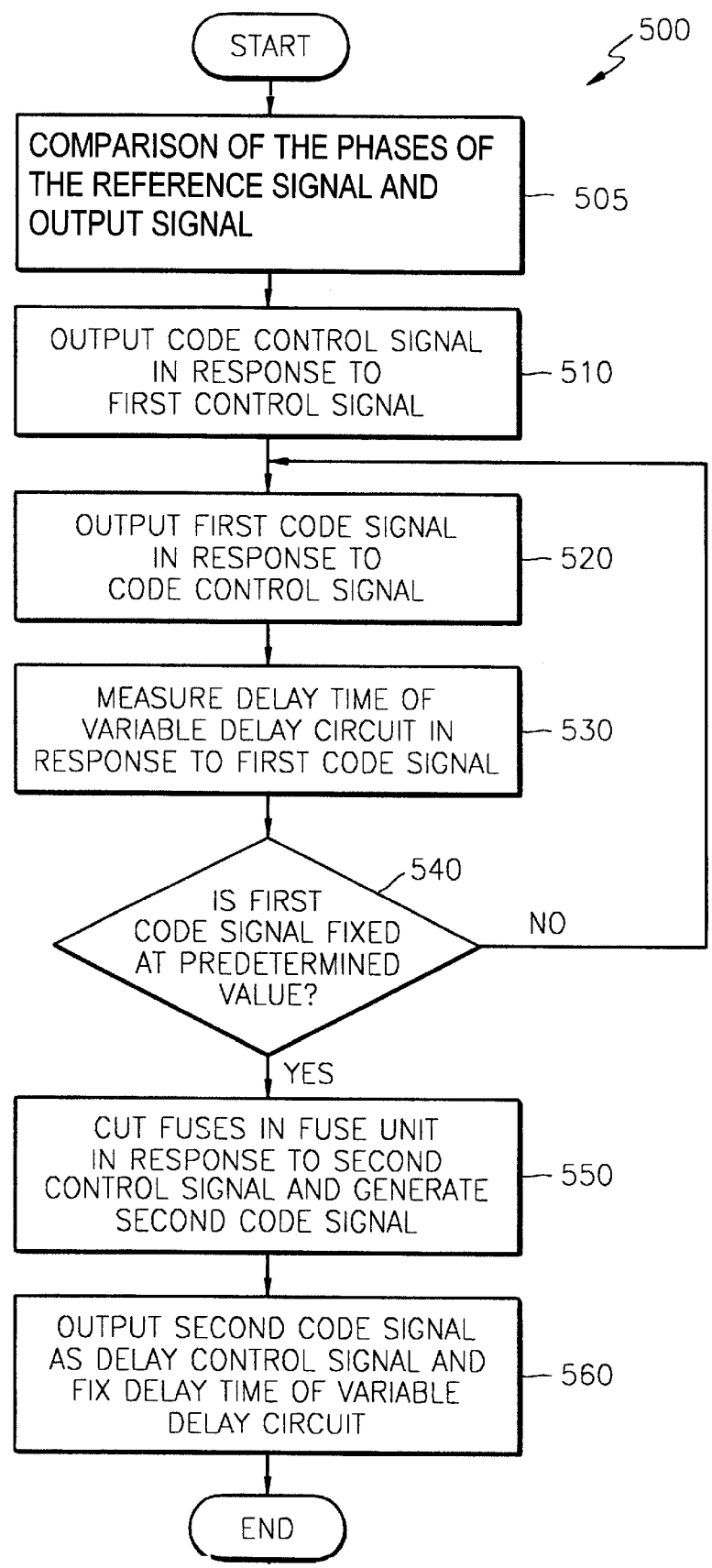
FIG. 5 illustrates a flow chart showing preferred steps of a method for generating a delay signal according to the second embodiment of the present invention.

Referring to FIG. 5, in an alternate method 500 for controlling the delay time of a delay time controlling circuit, which preferably includes a programmable variable delay circuit, a first step 505 preferably comprises comparing in response to an application of an enabling first control signal a the phase of a reference signal with a phase of a monitored output signal. In step 510, a code control signal is generated based on the result of the comparison in step 505. The first control signal, which is an enabling command for performing an auto-trimming operation by allowing the code control signal to be outputted, may be generated either internally or externally to the delay time controlling circuit. The monitored output signal may be the output signal of the variable delay circuit or may be another signal from a node in a same semiconductor memory device. In a next step 520, a first code signal, which is an m-bit signal (m is a natural number), is generated in response to the code control signal. Then, a delay time is generated in the programmable variable delay circuit in step 530. If the logic code value of the code control signal increases or decreases, the logic code of the first code signal is similarly varied.

When the phase of the reference signal is approximately the same as the phase of the output signal of the variable delay circuit, a logic code value of the first code signal varies narrowly about a fixed logic code value (i.e. is unchanging.)

A determination is made in step 540 as to whether the first code signal has been constant at a value for a predetermined amount of time in step 540. If the logic code of the first code signal has not been fixed at the predetermined value for the necessary amount of time, the first code signal remains applied to the variable delay circuit via a selector included in the delay time controlling circuit, such that the delay time of the variable delay circuit is continuously controlled and the logic code of the first code signal is continuously varied by the code control signal.

If the logic code value has been fixed (i.e. constant) for the a predetermined amount of time the auto-trimming operation Is halted, and the logic code value at that moment is output as the first code signal, and a fuse-cutting operation similar to that of the first embodiment begins. In other words, if the logic code of the first code signal is fixed for a predetermined time, the fuses in the fuse unit are cut based on the logic code of the first code signal, thereby generating a second code signal which is an m-bit signal that corresponds to the logic value of the fuses that are cut, is generated in step 550. When the second code signal is generated, the selector selects and outputs the second code signal to the variable delay circuit as a delay control signal in step 560. Then, hereafter a constant delay time is generated in the variable delay circuit in step 560.

As described above, the delay time controlling circuit and method according to the present invention are advantageous in controlling delay time in a completely packaged semiconductor memory device without the need of additional processes.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims

What is claimed is:

1. A delay time controlling circuit which controls a delay time to be applied to an electrical signal, the delay time controlling circuit comprising:
   a programmable variable delay circuit;
   a controller which generates a first code signal which is an m-bit signal (where m is a natural number) in response to a first control signal;
   a fuse unit, having a plurality of fuses, which receives the first code signal, cuts fuses in itself in response to a second control signal if the measured delay time(ant.) reaches a target delay time, and generates a second code signal, which is an m-bit signal (where m is a natural number) and corresponds to the logic value of that are cut;
   a selection fuse which is cut in response to a third control signal; and
   a selector which selects one of the first and second code signals based on whether or not the selection fuse is cut and outputs the selected code signal as a delay control signal for controlling the delay time of the variable delay circuit.

2. The delay time controlling circuit of claim 1, wherein the controller includes a register.

3. The delay time controlling circuit of claim 2, wherein the register receives the first control signal, stores the logic code of the first control signal, and outputs the stored logic code as the first code signal.

4. The delay time controlling circuit of claim 3, wherein the first control signal is an m-bit signal (where m is a natural number), the logic code of which is controlled externally to the delay time controlling circuit.

5. The delay time controlling circuit of claim 1, wherein the second control signal and the third control signal are applied externally to the delay time controlling circuit.

6. The delay time controlling circuit of claim 1, wherein the second control signal and the third control signal are the same signal.

7. The delay time controlling circuit of claim 1, wherein each one of the plurality of fuses in the fuse unit are electric fuses.

8. The delay time controlling circuit of claim 1, wherein the selector selects the second code signal and outputs the second code signal as the delay control signal only in a case where the selection fuse is cut.

9. The delay time controlling circuit of claim 1, wherein the selector is a multiplexer.

10. A delay time controlling circuit which controls a delay time the delay time controlling circuit comprising:
    a programmable variable delay circuit;
    a phase detector which compares a phase of a reference signal to a phase of an output signal in response to a first control signal and generates a code control signal (based on the results of the comparison);

a controller which generates a first code signal which is an m-bit signal (where m is a natural number) in response to the code control signal;

a fuse unit, having a plurality of fuses, which receives the first code signal, cuts fuses in itself in response to a second control signal if the measured delay time matches a target delay time, and generates a second code signal, which is an m-bit signal (where m is a natural number) and corresponds to the logic value of the fuses that are cut;

a selection fuse which is cut in response to a third control signal; and a selector which selects one of the first and second code signals based on whether or not the selection fuse is cut and outputs the selected one as a delay control signal for controlling the delay time of the variable delay circuit.

11. The delay time controlling circuit of claim 10, wherein the code control signal controls the logic code of the controller based on the difference in phase between the reference signal and the output signal.

12. The delay time controlling circuit of claim 10, wherein the controller includes a register.

13. The delay time controlling circuit of claim 12, wherein the register stores a predetermined logic code in response to the code control signal and outputs the predetermined logic code as the first code signal.

14. The delay time controlling circuit of claim 10, wherein the first control signal is a command signal for enabling the phase detector.

15. The delay time controlling circuit of claim 10, wherein the second control signal and the third control signal are applied external to the delay time controlling circuit.

16. The delay time controlling circuit of claim 10, wherein the second control signal and the third control signal are generated internal to the delay time controlling circuit.

17. The delay time controlling circuit of claim 10, wherein the second control signal and the third control signal are the same signal.

18. The delay time controlling circuit of claim 10, wherein each one of the plurality of fuses in the fuse unit are electric fuses.

19. The delay time controlling circuit of claim 10, wherein the selector selects the second code signal and outputs the second code signal as the delay control signal only in a case where the selection fuse is cut.

20. The delay time controlling circuit of claim 10, wherein the selector is a multiplexer.

21. A method for controlling the delay time of a delay time controlling circuit, the method comprising:

(a) outputting a first code signal which is an m-bit signal (where m is a natural number) in response to a first control signal;

(b) controlling and measuring the delay time of the variable delay circuit in response to the first code signal;

(c) cutting fuses in a fuse unit in response to a second control signal if the measured delay time reaches a target delay time and generating a second code signal which is an m-bit signal (where m is a natural number) and corresponds to the logic value of the fuses that are cut; and (d) outputting the second code signal as a delay control signal and thus fixing the delay time of the variable delay circuit.

22. The method of claim 21, wherein in the step (a), the first control signal is received and the logic code of the first control signal is generated as the first code signal.

23. The method of claim 21, wherein the first control signal is an m-bit signal (where m is a natural number), the logic code of which is controlled from the outside of the delay time controlling circuit.

24. The method of claim 21, wherein the second control signal is applied from the outside of the delay time controlling circuit.

25. The method of claim 21, wherein the fuses in the fuse unit are electric fuses.

26. A method for controlling the delay time of a delay time controlling circuit which controls the delay time of a variable delay circuit, the method comprising:

(a) comparing the phase of a reference signal which is an m-bit signal (where m is a natural number) and the phase of an output signal of the variable delay circuit in response to a first control signal and generating a code control signal based on the results of the comparison;

(b) generating a first code signal which is an m-bit signal (where m is a natural number) in response to the code control signal;

(c) controlling and measuring delay time of the variable delay circuit in response to the first code signal;

(d) cutting fuses in a fuse unit in response to a second control signal if the measured delay time reaches a target delay time and generating a second code signal which is an m-bit signal (where m is a natural number) and corresponds to the logic value of the fuses that are cut; and (e) outputting the second code signal as a delay control signal and thus fixing the delay time of the variable delay circuit.

27. The method of claim 26, wherein the code control signal controls the logic code of the first code signal based on the difference in phase between the reference signal and the output signal of the variable delay circuit.

28. The method of claim 26, wherein the first control signal is a command for comparing the phase of the reference signal and the phase of the output signal of the variable delay circuit.

29. The method of claim 26, wherein the second control signal is applied from the outside of the delay time controlling circuit.

30. The method of claim 26, wherein the second control signal is generated inside the delay time controlling circuit.

31. The method of claim 26, wherein the fuses in the fuse unit are electric fuses.

* * * * *